United States Patent [19]
Tung

[11] Patent Number: 6,144,069
[45] Date of Patent: Nov. 7, 2000

[54] LDMOS TRANSISTOR

[75] Inventor: Ming-Tsung Tung, Hsin-chu, Taiwan

[73] Assignee: United Microelectronics Corp., Hsin-chu, Taiwan

[21] Appl. No.: 09/366,377

[22] Filed: Aug. 3, 1999

[51] Int. Cl.⁷ .............................. H01L 29/78; H01L 29/10
[52] U.S. Cl. .............................................. 257/335; 257/336
[58] Field of Search ...................................... 257/335, 336

[56] References Cited

U.S. PATENT DOCUMENTS 5,252,848 10/1993 Adler et al. .
5,406,110 4/1995 Kwon et al. .
5,825,065 10/1998 Corso et al. .
5,841,166 11/1998 D'Anna et al. .
5,849,275 12/1998 Kitamura et al. .
5,959,335 9/1999 Bryant et al. .

*Primary Examiner*—Stephen D. Meier
*Attorney, Agent, or Firm*—Harness, Dickey & Pierce, P.L.C.

[57] ABSTRACT

A single side high voltage lateral diffused metal-oxide-semiconductor (LDMOS) transistor is disclosed. The drain side is low-voltage N-well with lower concentration to increase driving voltage while the source side is low-voltage P-well with higher concentration to increase the interior electric field such that the conductivity is improved and the threshold voltage is adjusted by high-voltage P-well with lower concentration.

9 Claims, 6 Drawing Sheets

LDMOS TRANSISTOR

BACKGROUND OF THE INVENTION

1. Field of the Invention

The present invention generally relates to the field of semiconductor devices, and more particularly to a lateral diffused metal-oxide-semiconductor (LDMOS) transistor.

2. Description of the Prior Art

Power semiconductor devices are currently being used in many applications. Such power devices include high-voltage integrated circuits which typically include one or more high-voltage transistors, often on the same chip as low-voltage circuitry. A commonly used high-voltage component for these circuits is the lateral double diffused MOS transistor (LDMOS). LDMOS structures used in high-voltage integrated circuits may generally be fabricated using some of the same techniques used to fabricate the low voltage circuitry or logic circuitry. In general, existing LDMOS structures are fabricated in a thick epitaxial layer of opposite conductivity type to the substrate.

High-power applications have called for the use of such lateral double diffused MOS transistors primarily because they possess lower "on" resistance, faster switching speed, and lower gate drive power dissipation than their bi-polar counterparts. These devices have heretofore also been strongly associated with bi-polar based process flows when integrated into a Bi-CMOS environment.

On the development of ultra-large-scale-integrated (ULSI), layout rule will shrink and the application of product is going to invent on multi-chip of integrated function. The prior LDMOS transistor is implemented by LOCOS process. Referring to FIG. 1, an N type well 112 and a P type well 110 with lighter concentration are formed in a P type substrate 100, and a field oxide (fox) region 120 is formed between gate 140 and source/drain 114A. However, this process could not meet the requirement of the layout rule for ULSI.

SUMMARY OF THE INVENTION

In accordance with the present invention, a method is provided for forming a LDMOS transistor that substantially can decrease the width of the LDMOS transistor.

It is another object of this invention to integrated a trench oxide process into LDMOS transistor.

In one embodiment, a single side high voltage LDMOS transistor comprises a substrate with a first conductivity type. A first high-voltage tank having a second conductivity type opposite that of the first conductivity type is formed in a face of the substrate. A second high-voltage tank having the first conductivity type is formed adjacent to and in contact with the first high-voltage tank, such that a major portion of the second high-voltage tank in not within the first high-voltage tank. A first low-voltage tank having the second conductivity type is formed within a face of the first high-voltage tank, such that at least one trench isolation regions are included within the first low-voltage tank. A second low-voltage tank having the first conductivity type is formed within the second high-voltage tank, such that a channel region exists between the second low-voltage tank and the first low-voltage tank. A conductivity gate having portions is formed over a portion of the first high-voltage tank, the second high-voltage tank, the first low-voltage tank, and the second low-voltage tank, and is insulatively disposed thereon. A first source/drain region is formed in the first low-voltage tank and a second source/drain region is formed in the second low-voltage tank adjacent opposite ends of the gate structure in the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Figure 1:
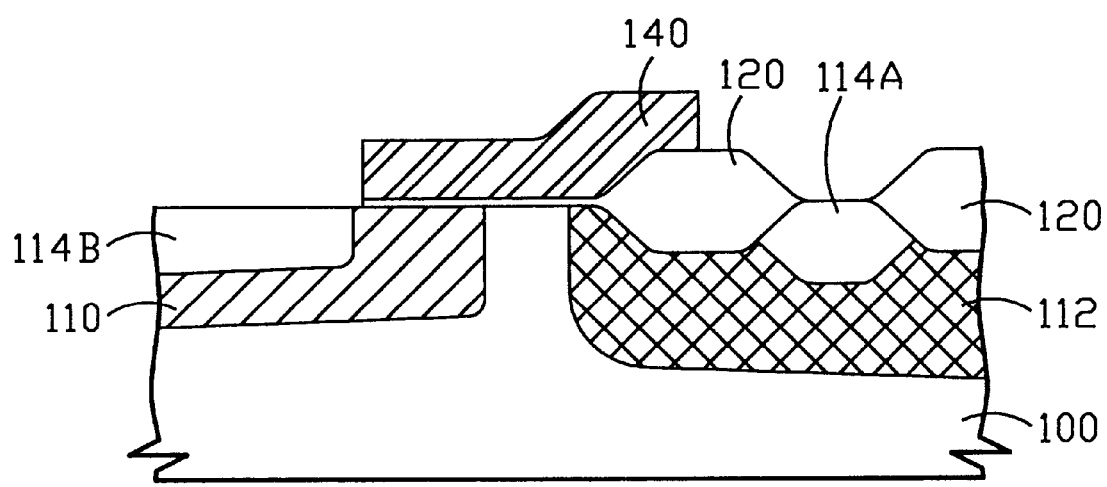
FIG. 1 is a cross-sectional view of a prior LDMOS transistor.
Figure 2A:
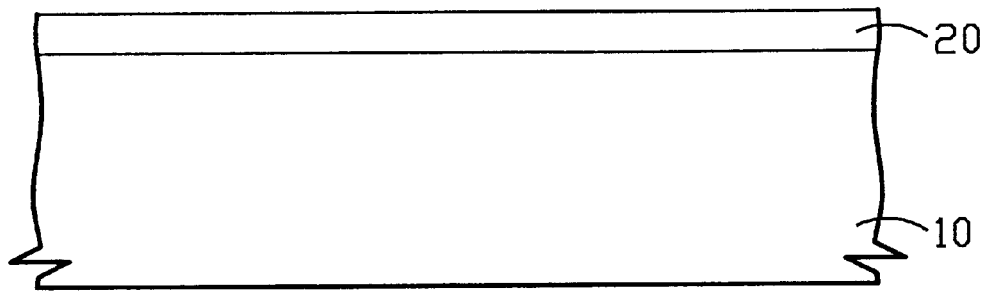
FIGS. 2A to 2O are schematic representations of structures at various stages during the formulation of LDMOS transistor in accordance with a method disclosed.

Referring to FIG. 2A, a P type substrate 10 is provided and a silicon oxide layer 20 is formed thereon. In this embodiment, since the provided P type substrate 10 is for N type MOS transistor, all P type and N type will interchange while an N type MOS transistor is provided. The oxide layer 20 with a thickness between about 100 to 300 angstroms is formed by any conventional method such as heated in furnace. This oxide layer 20 is a sacrificial oxide layer which is provided to prevent channel effect on the following ion implantation.

Figure 2B:
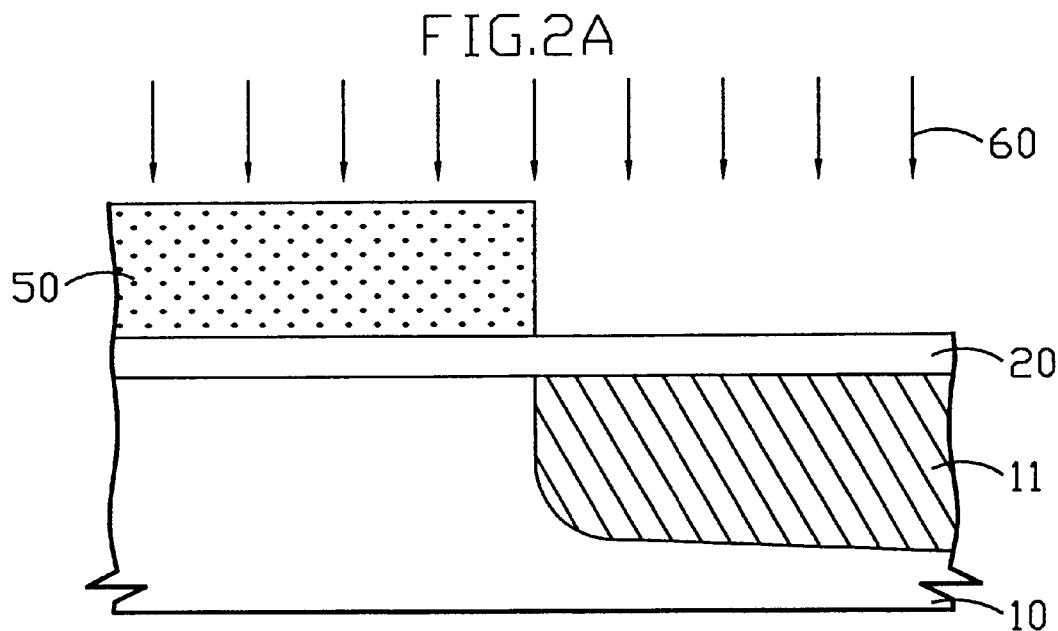
Figure 2C:
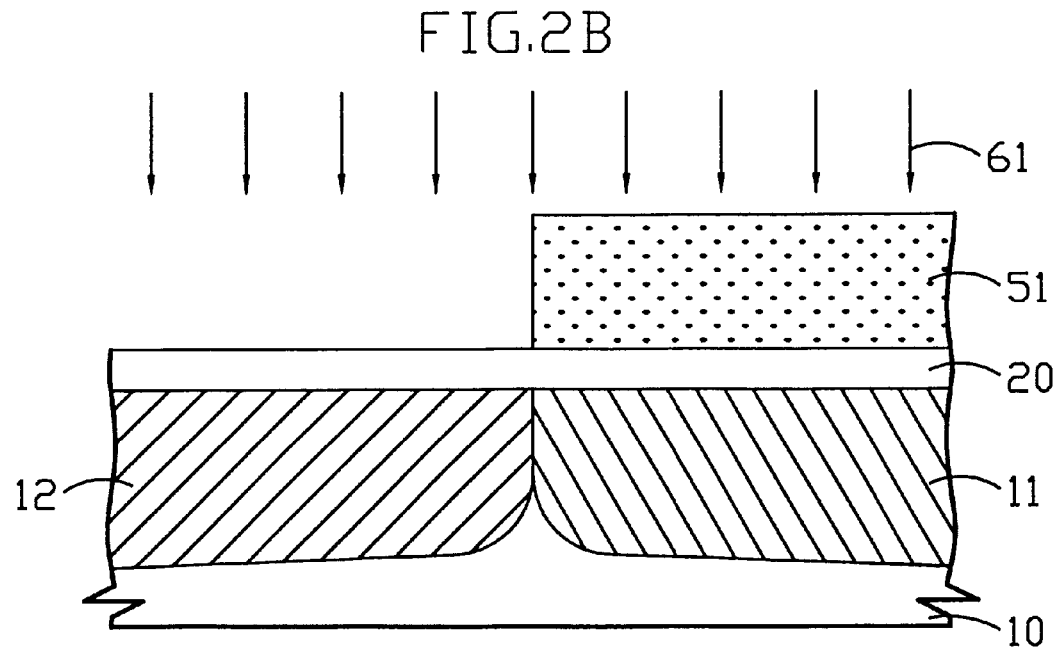
Figure 2D:
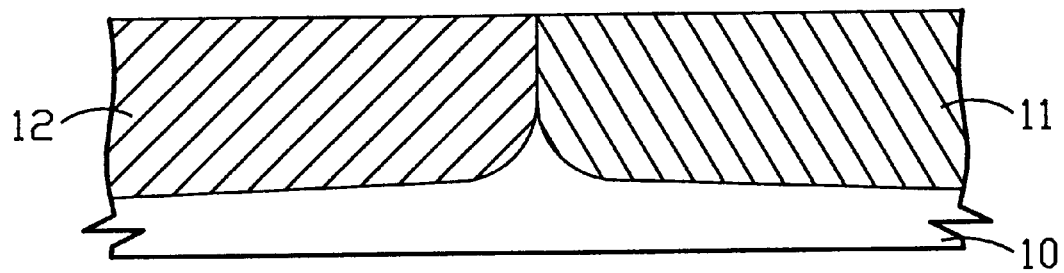

Referring to FIG. 2B, a photoresist layer 50 is formed on the oxide layer 20 by using any suitable method and transferred a high-voltage N-well pattern in this photoresist layer 50. Then, an ion implantation 60 is introduced into the substrate 10 to form a high-voltage N-well 11 and the photoresist layer 50 is then stripped. The term "high-voltage" denotes the voltages to which the devices formed in these wells will be subjected. High voltages, such as twelve and eighteen volts, or transients up to about sixty volts, usually require larger and deeper tanks but with smaller (or lighter) dopant concentrations. Similarly, another photoresist layer 51 is formed on this oxide layer 20 by using any suitable method and transferred a high-voltage P-well pattern in this photoresist layer 51, as shown in FIG. 2C. Then, an ion implantation 61 is introduced into the substrate 10 to form a high-voltage P-well 12 and the photoresist layer 51 is then stripped. Having finished the two ion implantation steps, the wafer is placed into a furnace and the implanted ions are driven into the substrate 10 by high temperature diffusion. Then, the oxide layer 20 is removed by any conventional method, as shown in FIG. 2D.

Figure 2E:
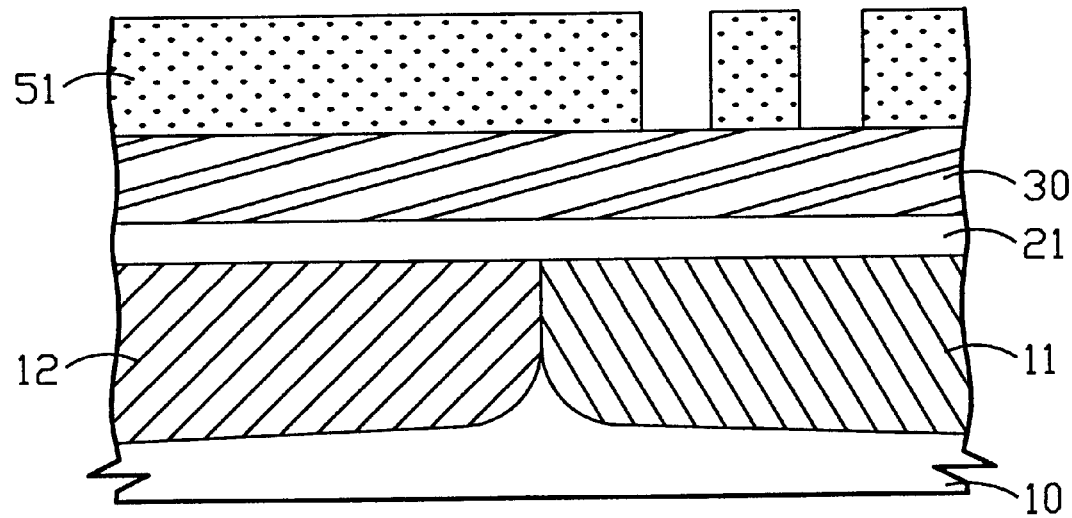

Referring to FIG. 2E, a pad oxide layer 21 is formed on the substrate 10 by using a conventional thermal method and has a thickness between about 100 to 200 angstroms. The purpose of the pad oxide layer 21 is to act as a buffer between the substrate 10 and following silicon nitride layer since shear stress is produced between the silicon crystal and the silicon nitride layer and defects will be generated. Then, a silicon nitride layer 30 is deposited on the pad oxide layer 21 by using any conventional method, such as the low pressure chemical vapor deposition (LPCVD) method or plasma enhanced chemical vapor deposition (PECVD) method, and has a thickness between about 1000 to 2000 angstroms. The prior application of silicon nitride layer is the mask of oxide layer in local oxidation (LOCOS) process. In this invention, the silicon nitride layer 30 is the mask of the substrate 10 in forming trench isolation.

A photoresist layer 52 is formed on the silicon nitride layer 30 and transferred a trench isolation pattern into the photoresist layer 52. There is only one trench isolation region in semiconductor device usually, however, two trench isolation patterns are shown in FIG. 2E. The amounts of trench isolation regions depend on the layout rule and line width, i.e., at least one trench isolation region may be formed.

Figure 2F:
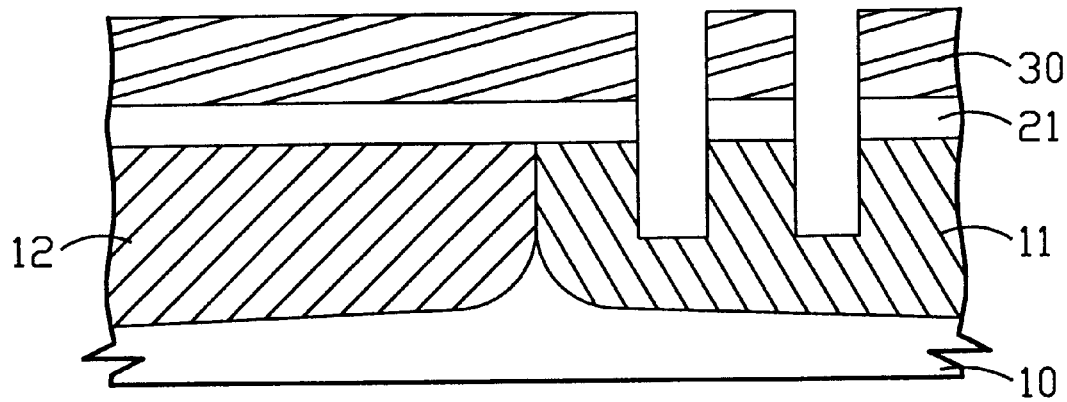

Referring to FIG. 2F, the silicon nitride layer 30, the pad oxide layer 21 and the substrate 10 are sequentially etched using photoresist layer 52 as a mask by using suitable method. This etching step is essentially anisotropically dry etching, and the photoresist layer 52 is then stripped.

Figure 2G:
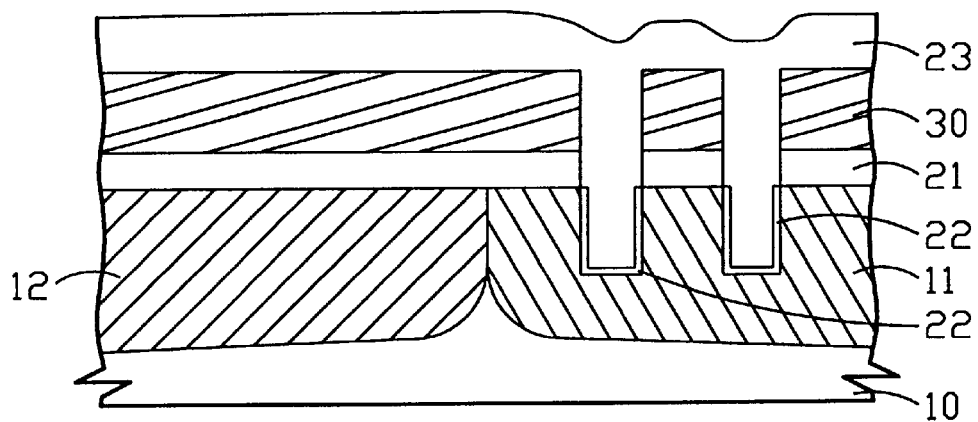

Then, the trench isolation openings are filled by silicon oxide. Referring to FIG. 2G, the wafer is placed into a furnace to grow a silicon oxide layer 22 with a thickness between about 100 to 500 angstroms. Then, another oxide layer 23 is deposited by using APCVD method and has a thickness between about 5000 to 9000 angstroms. Because the density of this APCVD oxide layer 23 is looser, the oxide layer 23 will be densitified by placing wafer into furnace to high temperature.

Figure 2H:
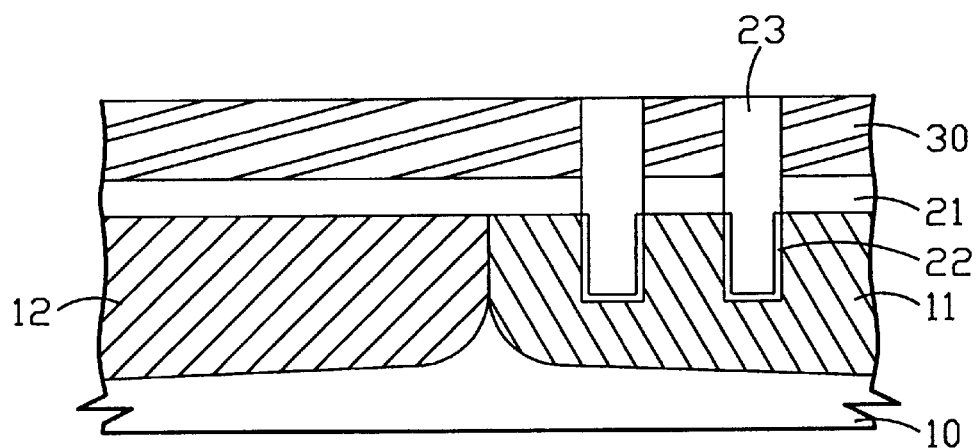
Figure 2I:
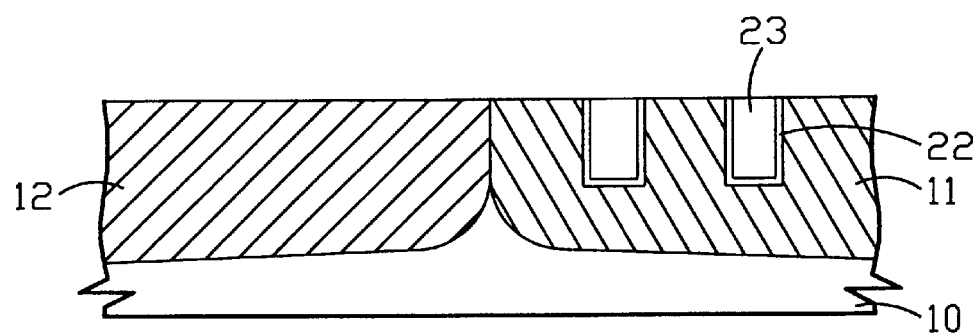

Referring to FIG. 2H, after depositing the oxide layer 23, this oxide layer 23 is planarized using chemical mechanical polishing method. Then, the silicon nitride layer 30 and the pad oxide layer 21 are removed by using any conventional method, as shown in FIG. 2I.

Figure 2J:
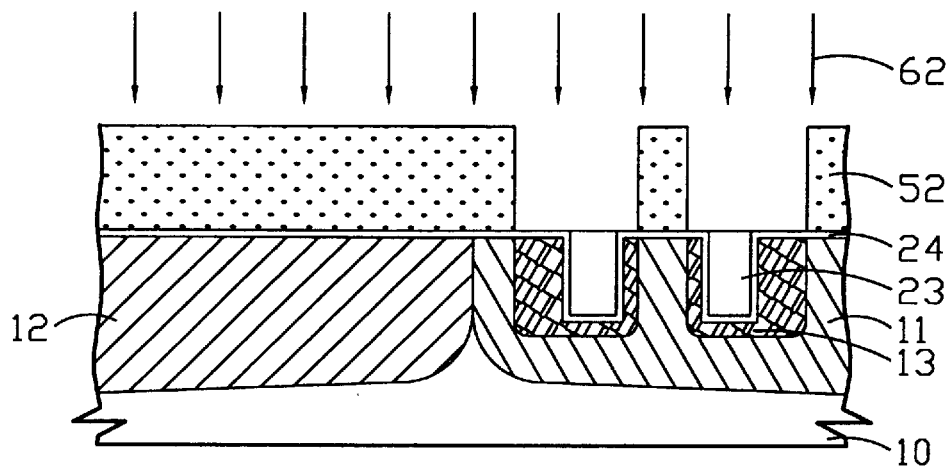
Figure 2K:
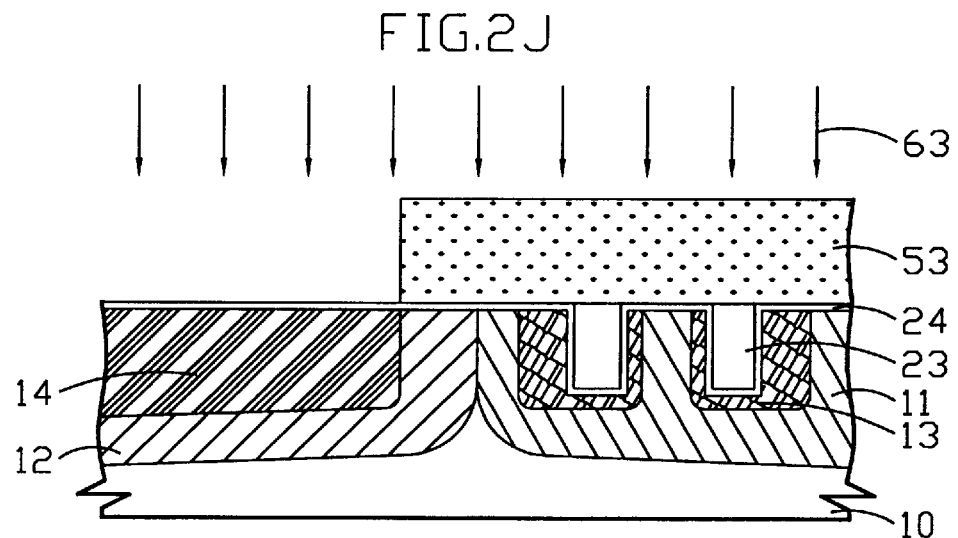

Before forming low-voltage N-well and P-well, another sacrificial oxide layer 24 is formed again on the substrate 10 and has a thickness between about 100 to 200 angstroms, as shown in FIG. 2J. Then, a photoresist layer 52 is formed on this oxide layer 24 by using any suitable method and transferred a low-voltage N-well pattern in this photoresist layer 52. Then, an ion implantation 62 is introduced into the substrate 10 to form a low-voltage N-well 13 and the photoresist layer 52 is then stripped. Similarly, another photoresist layer 53 is formed on this oxide layer 24 by using any suitable method and transferred a low-voltage P-well pattern in this photoresist layer 53, as shown in FIG. 2K. Then, an ion implantation 63 is introduced into the substrate 10 to form a low-voltage P-well 14 and the photoresist layer 53 is then stripped. Having finished the two ion implantation steps, the wafer is placed into furnace and annealed by high temperature diffusion. Then, the oxide layer 24 is removed by any conventional method.

Figure 2L:
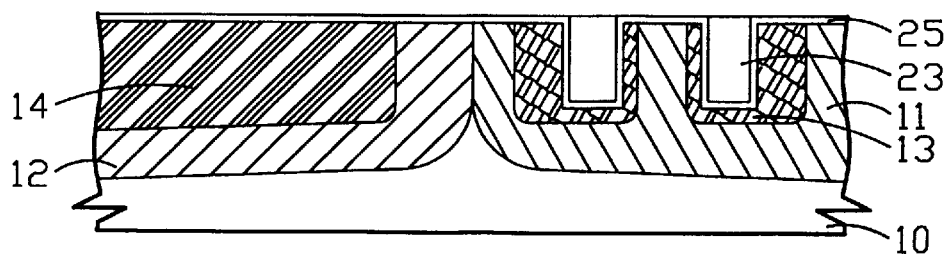
Figure 2M:
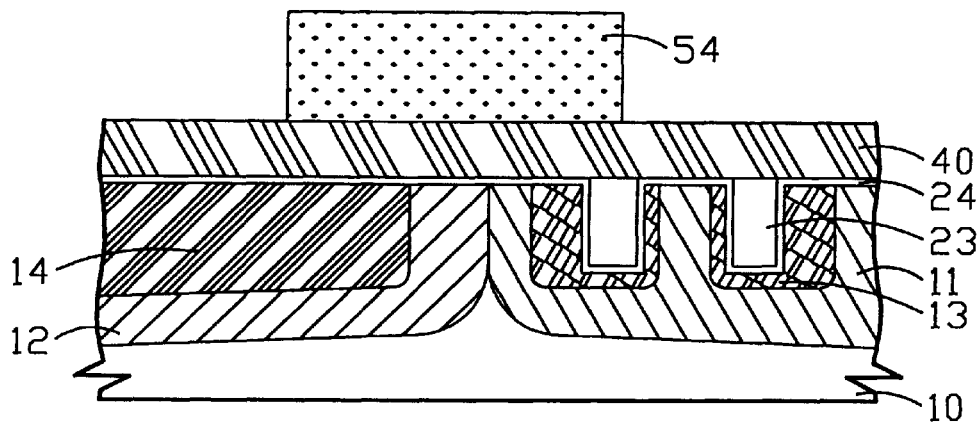

The following steps are for forming gate, source and drain in MOS transistor. Referring to FIG. 2L, a gate oxide layer 25 is formed on the substrate 10 by using any conventional method. A polysilicon layer 40 is deposited and doped on the oxide layer 25 by using any conventional method, as shown in FIG. 2M. In the preferred embodiment, the gate electrode comprises doped polysilicon. Other conductive materials including metals or silicides can also be used. Then, a photoresist layer 54 is formed on the polysilicon layer 40 and transferred a gate pattern into this photoresist layer 54. The gate pattern will overlap a portion of trench isolation region and a portion of low-voltage P-well 13.

Figure 2N:
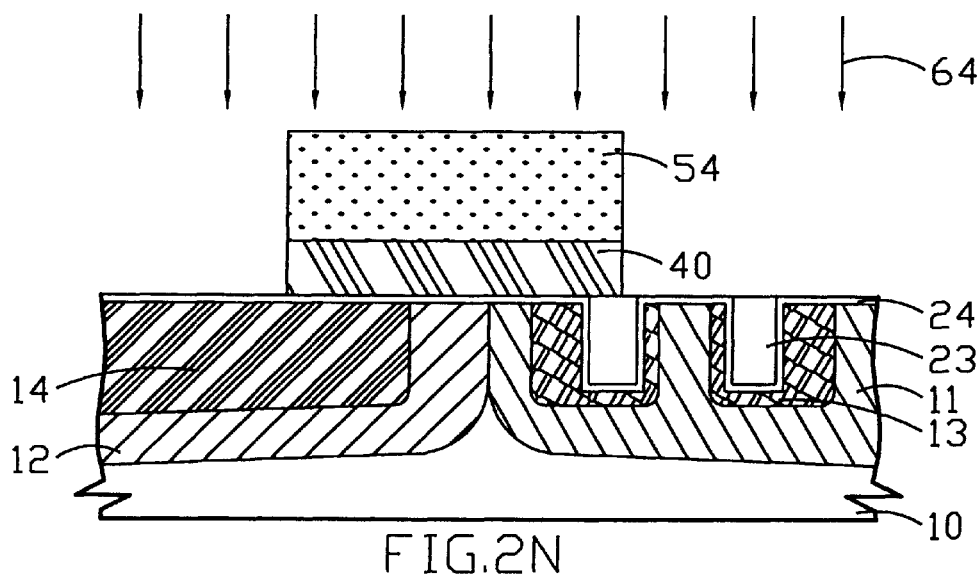
Figure 2O:
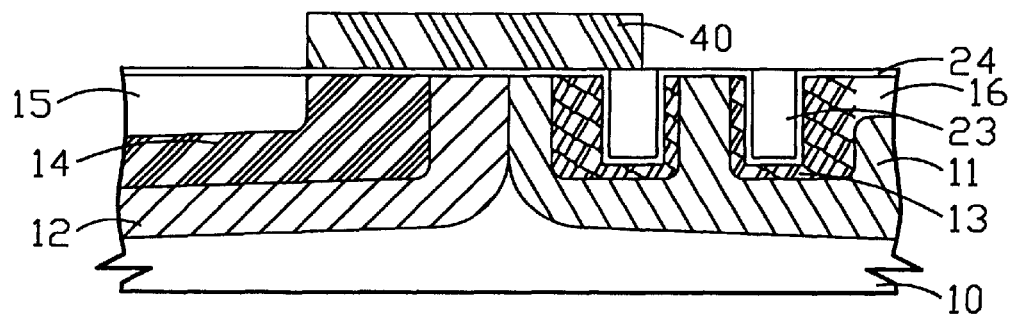

Then, the polysilicon layer 40 is etched to form a gate electrode by using conventional etching 64, as shown in FIG. 2N. Next, source and drain regions 15 and 16 are formed on the opposite ends of the gate structure.

Although specific embodiments have been illustrated and described, it will be obvious to those skilled in the art that various modifications may be made without departing from what is intended to be limited solely by the appended claims.

What is claimed is:

1. An LDMOS transistor, said transistor comprising:
   a substrate having a first conductivity type;
   a first high-voltage tank having a second conductivity type opposite that of said first conductivity type formed in a face of said substrate;
   a second high-voltage tank having said first conductivity type formed adjacent to and in contact with said first high-voltage tank, such that a major portion of the second high-voltage tank is not within the first high-voltage tank;
   a first low-voltage tank having said second conductivity type formed within a face of said first high-voltage tank, such that at least one trench isolation region is included within said first low-voltage tank;
   a second low-voltage tank having said first conductivity type formed within said second high-voltage tank, such that a channel region exists between said second low-voltage tank and said first low-voltage tank;

a conductivity gate having portions formed over a portion of said first high-voltage tank, said second high-voltage tank, said first low-voltage tank, and said second low-voltage tank, and insulatively disposed thereon; and a first source/drain region in said first low-voltage tank and a second source/drain region in said second low-voltage tank adjacent opposite ends of said gate structure in said substrate.

2. The LDMOS transistor according to claim 1, wherein the concentration of said high-voltage tank is lower than the concentration of said low-voltage tank.

3. The LDMOS transistor according to claim 1, wherein said trench isolation region is formed by filling silicon oxide into trench.

4. The LDMOS transistor according to claim 3, further comprising a thermally grown silicon oxide layer.

5. The LDMOS transistor according to claim 1, wherein said substrate comprises a silicon layer.

6. A single side high voltage LDMOS transistor, said transistor comprising:

a silicon layer having a first conductivity type;

a first high-voltage tank having a second conductivity type opposite that of said first conductivity type formed in a face of said substrate;

a second high-voltage tank having said first conductivity type formed adjacent to and in contact with said first high-voltage tank, such that a major portion of the second high-voltage tank is not within the first high-voltage tank;

a first low-voltage tank having said second conductivity type formed within a face of said first high-voltage tank, such that at least one trench isolation region is included within said first low-voltage tank;

a second low-voltage tank having said first conductivity type formed within said second high-voltage tank, such that a channel region exists between said second low-voltage tank and said first low-voltage tank;

a conductivity gate having portions formed over a portion of said first high-voltage tank, said second high-voltage tank, said first low-voltage tank, and said second low-voltage tank, and insulatively disposed thereon; and a first source/drain region in said first low-voltage tank and a second source/drain region in said second low-voltage tank adjacent opposite ends of said gate structure in said substrate.

7. The LDMOS transistor according to claim 6, wherein the concentration of said high-voltage tank is lower than the concentration of said low-voltage tank.

8. The LDMOS transistor according to claim 6, wherein said trench isolation region is formed by filling silicon oxide into trench.

9. The LDMOS transistor according to claim 8, further comprising a thermally growing a silicon oxide layer.

* * * * *